United States Patent [19]
Desai et al.

[11] Patent Number: 5,446,246
[45] Date of Patent: Aug. 29, 1995

[54] MLC CONDUCTOR PATTERN OFF-SET DESIGN TO ELIMINATE LINE TO VIA CRACKING

[75] Inventors: Kamalesh S. Desai, Hopewell Junction; Donald W. DiAngelo, Fishkill, both of N.Y.

[73] Assignee: International Business Machines Corporation, Armonk, N.Y.

[21] Appl. No.: 186,227

[22] Filed: Jan. 24, 1994

Related U.S. Application Data

[63] Continuation of Ser. No. 921,539, Jul. 29, 1992, abandoned.

[51] Int. Cl.⁶ ............................................. H05K 01/00
[52] U.S. Cl. .................................... 174/262; 174/52.4
[58] Field of Search .................... 174/51, 52.2, 52.3, 174/262, 263, 264, 265, 266

[56] References Cited
U.S. PATENT DOCUMENTS 3,335,489  8/1967  Grant .................................. 29/628
3,571,923  3/1971  Shaheen et al. .
3,859,711  1/1975  McKiddy .
4,340,436  7/1982  Dubetsky et al. .
4,808,434  2/1989  Bennett et al. .
5,023,699  6/1991  Hara et al. .
5,081,067  1/1992  Shimizu et al. .

Primary Examiner—Leo P. Picard
Assistant Examiner—Cheryl R. Figlin
Attorney, Agent, or Firm—Aziz M. Ahsan; Graham S. Jones, II

[57] ABSTRACT

A semiconductor ceramic packaging substrate has the usual vias of sintered electrically conductive metal extending through the substrate. There are the usual metal conductor lines comprising conductive elements on the surface of the substrate. Each via is connected to the conductive elements in a predetermined pattern through a conductive via cap on the surface of the ceramic package. The caps join each conductive element and each via. The cap has a width substantially larger than the diameter of the via at the point of contact of the via and the conductive element in contact with it. The caps are also substantially thicker and wider than the conductive elements.

19 Claims, 2 Drawing Sheets

MLC CONDUCTOR PATTERN OFF-SET DESIGN TO ELIMINATE LINE TO VIA CRACKING The application is a continuation of application Ser. No. 07/921,539, filed Jul. 29, 1992, now abandoned.

BACKGROUND OF THE INVENTION

1. Field of the Invention

This invention relates to packaging of semiconductor chips and more particularly to line-to-via connections in ceramic packaging structures.

2. Description of Related Art

In current multilayered ceramic packaging, the conductor lines are being narrowed in an attempt to maximize the use of space on the package to increase the density of the package.

The problem addressed here is that in view of the narrowness of the circuit conductors and the mechanics of formation of multilayered glass ceramic packages, there is a tendency for line-to-via cracking opens defects to appear where thin conductor lines are joined to large vias. One possible problem is that large copper grains are employed. In addition, opens are caused by contamination and line thinning at line-to-via junctions.

In FIG. 1, a multilayered ceramic package 10 has a set of vias 11, 12, 13 connected in turn to lines 14, 15, 16 with conductor lines 14–16 being very narrow, i.e. only about 76 μm (3 mils) wide. As can be seen the vias are far larger in width than the conductor lines and a problem of cracking at the junction or interface between the line and the via leads to open circuits to an undesirable degree.

FIG. 3A is a plan view of a segment of the prior art package of FIG. 1 rotated 90°. FIG. 3B is a section of FIG. 3A taken along line 3B—3B showing the thickness of prior art line-to-via connections. FIG. 3A and FIG. 3B show a fragment of the plan and sectional schematics of the package FIG. 1 with one of the prior art line to via connections of FIG. 1. The via 12 of FIG. 1 is connected in turn to line 14 with conductor lines 15 being thin, having a thickness t₁ only about 12 μm (0.5 mil) thick.

In accordance with this invention, a semiconductor ceramic packaging substrate has vias of sintered electrically conductive metal therethrough and metal conductive elements on the surface thereof. The vias are connected to the conductive elements in a predetermined pattern. The improvement comprises a via having a conductive cap on the surface thereof. The conductive cap joins the via and the conductive element. The cap has a width substantially larger than the diameter of the vias at the point of contact of each of the vias and the associated conductor in contact therewith.

Further in accordance with this invention, a semiconductor glass ceramic packaging substrate has vias of sintered electrically conductive metal therethrough and metal conductive elements on the surface thereof. The vias are connected to the conductive elements in a predetermined pattern. The improvement comprises the via having a conductive cap on the surface thereof. The cap joins the via and the conductive element. The conductive cap has a width on the order of 1.5 to 2 times the diameter of the vias at the point of contact of each of the vias and the associated conductor in contact therewith.

In semiconductor ceramic packaging substrates having vias of sintered electrically conductive metal therethrough and metal conductive elements on the surface thereof, the vias are connected to the conductive elements in a predetermined pattern. The improvement comprises a conductive via cap on the surface of the via. The via cap has a cross sectional area substantially larger than the cross sectional area of the conductive element at the point of contact of the via cap and the conductive element in contact therewith.

In summary, a semiconductor ceramic packaging substrate has the usual vias of sintered electrically conductive metal extending through the substrate. There are the usual metal conductor lines comprising conductive elements on the surface of the substrate. Each via is connected to the conductive elements in a predetermined pattern through a conductive via cap on the surface of the ceramic package. The caps join each conductive element and each via. The cap has a width substantially larger than the diameter of the via at the point of contact of the via and the conductive element in contact with it. The caps are also substantially thicker and wider than the conductive elements.

BRIEF DESCRIPTION OF THE DRAWINGS

The foregoing and other aspects and advantages of this invention are explained and described below with reference to the accompanying drawings, in which:

FIG. 3A is a plan view of a segment of the prior art package of FIG. 1 rotated 90°.

FIG. 4A is a plan view of a segment of the package of FIG. 2.

DESCRIPTION OF THE PREFERRED EMBODIMENT

Figure 1:
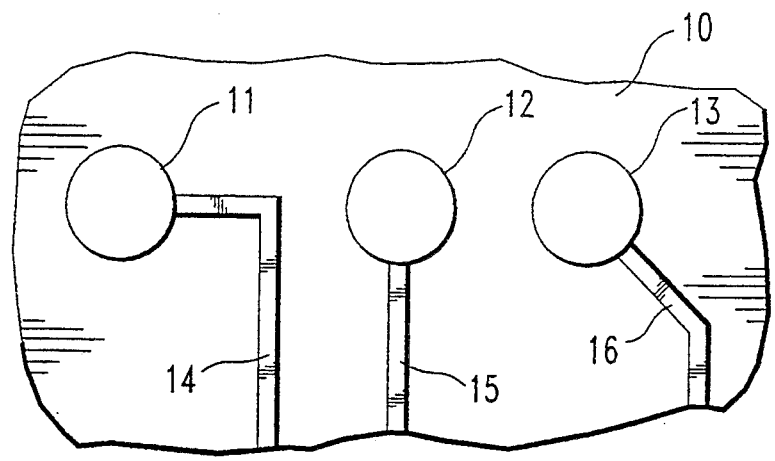
FIG. 1 is a schematic diagram showing a plan view of a prior art set of line-to-via connections of a package for semiconductor circuits.
Figure 2:
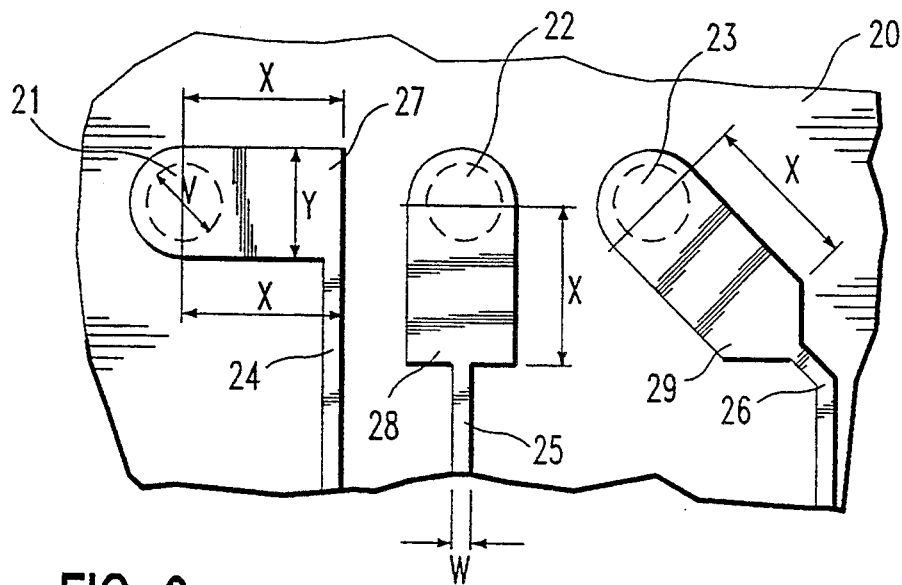
FIG. 2 is a schematic diagram showing a plan view of a a set of line-to-via connections for a semiconductor circuit package, the connections being configured in accordance with this invention.
Figure 3B:
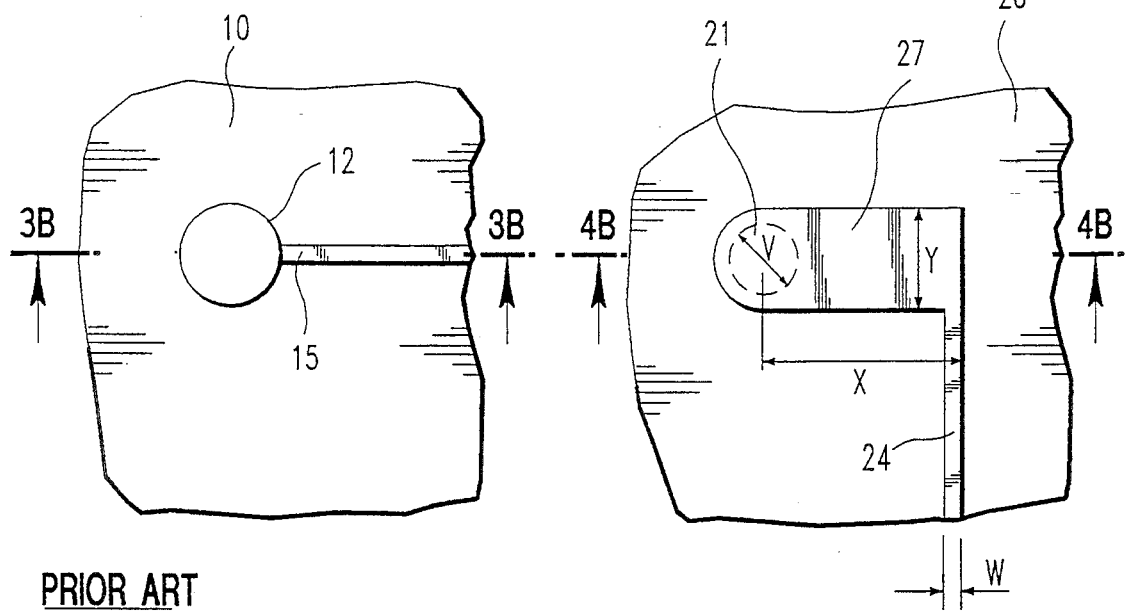
FIG. 3B is a diagrammatic sectional view of FIG. 3A taken along line 3B—3B showing the thickness of prior art line-to-via connections.
Figure 3B:
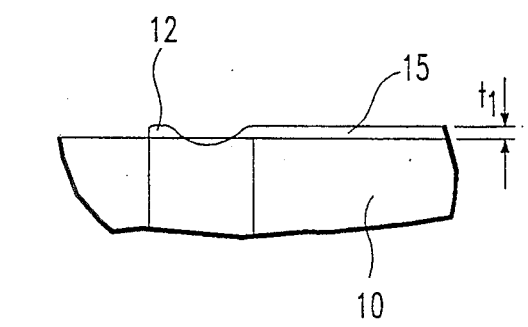

In FIG. 2, a multilayered ceramic package 20 has a set of vias 21, 22, 23 indicated by the dotted lines (in phantom) connected in turn to lines 24, 25, 26 with conductor lines 24–26 being very narrow, i.e. only about 76 μm (3 mils) wide. The new via caps 27–29 provided in accordance with this invention at the via ends of conductor lines 24–26 respectively are considerably wider than the conductor lines 24–26. As can be seen the vias 21, 22, 23 are far narrower (less wide) than the via caps 27–29 of conductor lines 24–26 respectively. Accordingly, as a result of the thicker structure at the cap the problem of cracking at the junction or interface between a line and the corresponding via no longer leads to open circuits to any considerable degree.

The line-to-via connection is redesigned to provide thick paste deposit and a large cross sectional area both in the vicinity of the line-to-via junction, and at the line-to-via junction to reduce latent and actual open defects.

The length of the enlarged via caps 27–29 of the conductor lines preferably have a line-offset-segment length X and a via cap diameter y which have a relationship as follows:

$$x = (\alpha)y,$$

where
- $\alpha$ = from about 1.5 to about 2
- x = line off-set segment length
- v = via diamter
- y = via cap diameter y > v (y is greater than the via diameter v, but y = equals the width of the enlarged via caps where they overlie the vias 21-23.

Figure 4B:
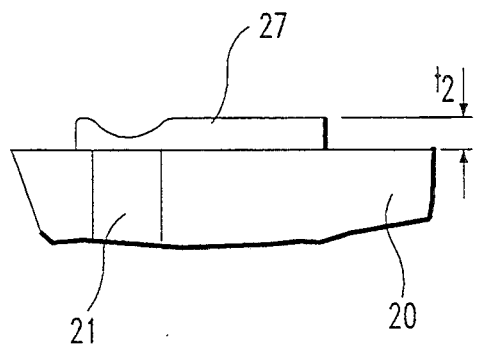
FIG. 4B is a diagrammatic sectional view of FIG. 4A taken along line 4B—4B showing the thickness of line-to-via connections in accordance with this invention.

FIG. 4A is a plan view of a segment of the package of FIG. 2. FIG. 4B is a section of FIG. 4A taken along line 4B—4B showing the thickness of line-to-via connections employed in the embodiment of this invention shown in FIG. 2.

In FIGS. 4A and 4B, the portion of the multilayered ceramic package 20 including vias 21 and via cap 27 is shown. Via cap 27 is connected to line 24, but conductor lines 24 is thinner, i.e. only about 12 $\mu$m (0.05 mils) thick.

The via cap 27 which is about 25 $\mu$m–50 $\mu$m (1-2 mils) thick 24 is considerably thicker than the conductor line 24 which is about 12 $\mu$m (0.5 mils) thick. As the via cap 27 (as well as caps 28 and 29, etc.) is so thick, the problem of cracking at the junction or interface between line 24 and the corresponding via 21 no longer leads to open circuits to nearly the same degree.

The parameters of the circuits of FIGS. 4A and 4B have important relationships, as described above. The parameters are as follows:
- v = via diameter = 75 $\mu$m–175 $\mu$m (3 mils–7 mils)
- y = via cap diameter = 125 $\mu$m–225 $\mu$m (5 mils–9 mils)
- x = line off-set = 188 $\mu$m–338 $\mu$m (7.5–13.5 mils) segment length
- w = line width = 75 $\mu$m–125 $\mu$m (3 mils–5 mils)
- $t_1$ = line thickness = 12 $\mu$m (0.5 mils)
- $t_2$ = via cap thickness = 25 $\mu$m–50 $\mu$m (1 mils–2 mils) where $t_2 \geq 2 t_1$ While this invention has been described in terms of the above embodiment(s), those skilled in the art will recognize that the invention can be practiced with modifications withing the spirit and scope of the appended claims.

Having thus described the invention, what is claimed as new end desirable end desired to be secured by Letters Patent is as follows:

1. A process to eliminate line to via cracking comprising the steps of,
    (a) forming a solid via inside a substrate such that one end of said via is exposed and substantially shares the surface of said substrate,
    (b) forming a via cap over said exposed via such that said exposed via is completely enveloped by said via cap and wherein said via cap is substantially larger in size than said via, and
    (c) forming a line to electrically connect said via through said via cap.

2. The process of claim 1, wherein said substrate is a ceramic substrate.

3. The process of claim 1, wherein said substrate is a glass ceramic substrate.

4. The process of claim 1, wherein said via has a first diameter and said via cap has a second diameter at the point of contact with said via and wherein said second diameter is about 1.5 to about 2.0 times larger than said first diameter.

5. The process of claim 1, wherein said via cap has a width substantially larger than the diameter of said via at the point of contact between said via cap and said via.

6. The process of claim 1, wherein said via cap has a substantially round shape at one end which is over said via and a substantially square shape at the opposite end.

7. The process of claim 1, wherein said via has a diameter between about 75 microns to about 175 microns and said via cap has a diameter of between about 125 microns to about 225 microns.

8. The process of claim 7, wherein the width of said line is between about 75 microns to about 125 microns.

9. The process of claim 7, wherein said via cap has a thickness from about 25 microns to about 50 microns.

10. The process of claim 1, wherein steps (b) and (c) are performed simultaneously.

11. A structure to eliminate line to via cracking comprising, a solid via embedded in a substrate such that at least one end of said via is exposed and is substantially parallel to the surface of said substrate, a via cap which is substantially larger than said via completely envelopes said via, and an electrically conductive line provides electrical connection to said via through said via cap.

12. The structure of claim 11, wherein said substrate is a ceramic substrate.

13. The structure of claim 11, wherein said substrate is a glass ceramic substrate.

14. The structure of claim 11 wherein said via has a first diameter and said via cap has a second diameter at the point of contact with said via and wherein said second diameter is about 1.5 to about 2.0 times larger than said first diameter.

15. The structure of claim 11, wherein said via cap has a width substantially larger than the diameter of said via at the point of contact between said via cap and said via.

16. The structure of claim 11, wherein said via cap has a substantially round shape at one end which is over said via and a substantially square shape at the opposite end.

17. The structure of claim 11, wherein said via has a diameter between about 75 microns to about 175 microns and said via cap has a diameter of between about 125 microns to about 225 microns.

18. The structure of claim 17, wherein the width of said line is between about 75 microns to about 125 microns.

19. The structure of claim 17, wherein said via cap has a thickness from about 25 microns to about 50 microns.

* * * * *